United States Patent [19]
Fujisawa

[11] Patent Number: 5,363,424
[45] Date of Patent: Nov. 8, 1994

[54] PARTIALLY-OPERABLE DRIVER CIRCUIT

[75] Inventor: Yoshimitu Fujisawa, Osaka, Japan

[73] Assignee: Oki Electric Industry Co., Ltd., Tokyo, Japan

[21] Appl. No.: 26,380

[22] Filed: Mar. 4, 1993

[30] Foreign Application Priority Data

Mar. 9, 1992 [JP] Japan .................. 4-050738

[51] Int. Cl.⁵ ............................................. G11C 19/28
[52] U.S. Cl. ............................ 377/69; 377/73; 377/76; 377/77
[58] Field of Search ............... 377/54, 55, 56, 64, 377/60, 69, 70, 75, 45, 73, 76, 77

[56] References Cited

U.S. PATENT DOCUMENTS

| | | | |
|---|---|---|---|
| 4,850,000 | 7/1989 | Dias | 377/54 |
| 4,852,130 | 7/1989 | Draxelmayr | 377/54 |
| 4,951,301 | 8/1990 | Zulian | 377/54 |
| 5,017,914 | 5/1991 | Uchida et al. | 340/784 |
| 5,164,970 | 11/1992 | Shin et al. | 377/80 |

*Primary Examiner*—Timothy P. Callahan
*Assistant Examiner*—My-Trang Nu Ton
*Attorney, Agent, or Firm*—Panitch, Schwarze, Jacobs & Nadel

[57] ABSTRACT

A driver circuit comprising an output level selection circuit and a shift register is disclosed. The output level selection circuit has driving terminals, potential level input terminals and data input terminals, and an output signal having one of the different potential levels from the driving terminals in response to the data signals. The shift register includes an input terminal, an output terminal, a control terminal, a control circuit, a first shift circuit, and a second shift circuit. The first shift circuit has an input coupled to the input terminal of the shift register and the control circuit, and an output coupled to the control circuit. The second shift circuit has an input coupled to the control circuit and an output coupled to the output terminal of the shift register. The control circuit couples the input terminal to the input of the first shift stage circuit and also couples the output of the first shift stage circuit and the input of the second shift stage circuit when a control signal is in a first state. Similarly, the control circuit couples the input terminal to the input of the second shift circuit when the control signal is in a second state.

23 Claims, 7 Drawing Sheets

PARTIALLY-OPERABLE DRIVER CIRCUIT

CROSS REFERENCE TO RELATED APPLICATION

This application claims the priority of Japanese Application Serial No. 50,738/1992, filed Mar. 9, 1991, the subject matter of which is incorporated herein by reference.

BACKGROUND OF THE INVENTION

The present invention relates to a driver circuit for driving a dot-matrix panel, and more specifically to a driver circuit capable of operating only a portion of driving outputs thereof.

A driver circuit for driving a dot-matrix panel has been disclosed in U.S. applicaton Ser. Nos. 857,637, now U.S. Pat. No. 5,270,696 filed Mar. 25, 1992, 825,384, now U.S. Pat. No. 5,227,790 filed Jan. 24, 1992, and 627,408, now U.S. Pat. No. 5,164,970,filed Dec. 14, 1990 all assigned to the same assignee as the present application. The disclosed driver circuit is connected in plural form. The driver circuits thus connected can operate their corresponding driving outputs.

When, however, the number of driving signal lines of the dot-matrix panel is not divided by the number of the driving outputs of each driver circuit, a portion of the driving outputs thereof is operated in spite of its unnecessity.

SUMMARY OF THE INVENTION

It is an object of the present invention to provide a driver circuit capable of stopping the operations of unnecessary driving outputs thereof.

It is another object of the present invention to provide a driver circuit capable of dividing driving outputs thereof and operating the divided driving outputs.

The above object are generally achieved according to the present invention by a driver circuit comprising an output level selection circuit having driving terminals, potential level input terminals to which different electrical potential levels are applied and data input terminals receiving data signals, for outputting a signal having one of the different potential levels from the driving terminals in response to the data signals, an input terminal receiving an input signal, an output terminal, a control terminal receiving a control signal which has a first state and a second state, and a shift register coupled to the data input terminals of the output level selection circuit, the control terminal and the input and output terminals for generating the data signals from the input signal. The shift register includes a first shift register circuit having an input coupled to the input terminal and an output, the second shift register circuit having the data latch circuits serially coupled each other, and a control circuit having a first terminal coupled to the input terminal, a second terminal coupled to the output of the first shift register circuit, a third terminal coupled to the input of the second shift register circuit and a control terminal coupled to the control terminal. Each of the first and second shift register circuits has data latch circuits serially coupled each other. The control circuit couples the first and third terminals thereof in response to the first state of the control signal and couples the second and third terminals thereof in response to the second state of the control signal.

BRIEF DESCRIPTION OF THE DRAWINGS

These and other features and advantages of the invention will be further understood from the following detailed description of the preferred embodiments with reference to the accompanying drawings in which.

DETAILED DESCRIPTION OF THE PREFERRED EMBODIMENTS

Figure 1A:
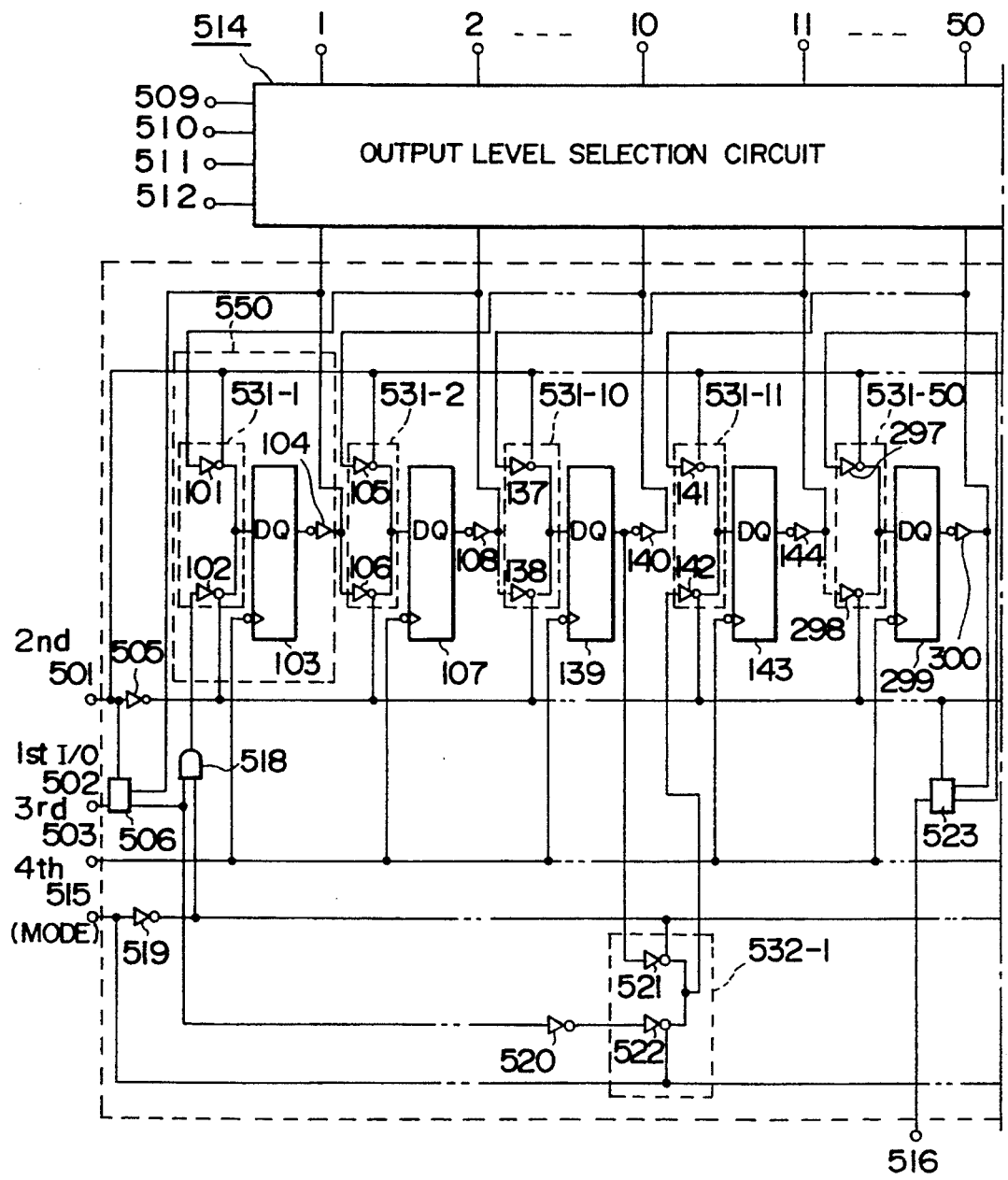
FIG. 1 consisting 1A and 1B,is a diagram showing a driver circuit according to a first embodiment of the present invention.
Figure 1B:
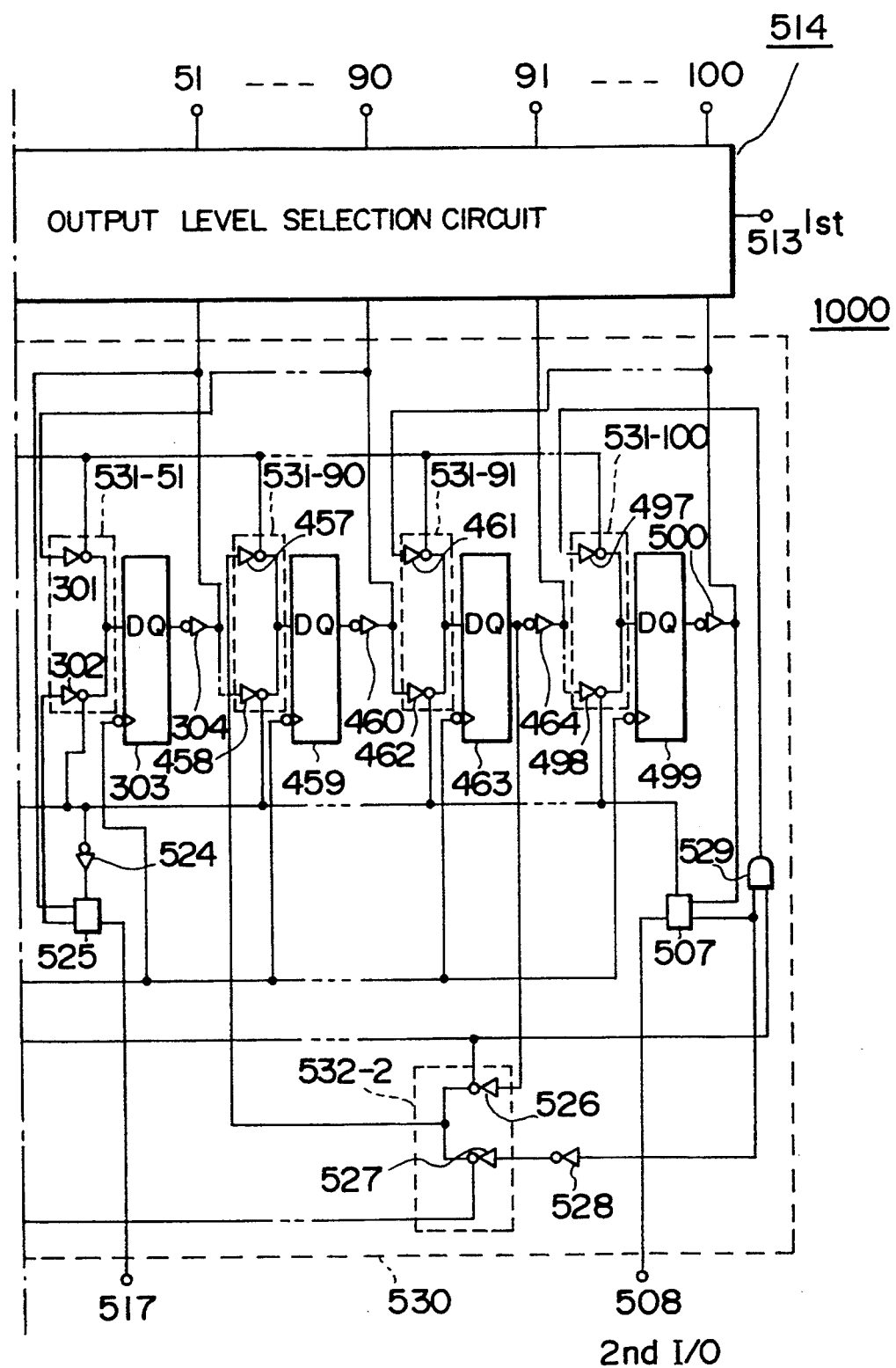

FIG. 1 shows a driver circuit according to a first embodiment of the present invention. A driver circuit 1000 comprises an output level selection circuit 514 and a bidirectional shift register 530. The output level selection circuit 514 has a plurality of liquid-crystal driving terminals 1 through 100, first to fourth driving potential level input terminals 509 through 512 and a first signal input terminal 513. The shift register 530 has a second signal input terminal 501, a third signal input terminal 503, a fourth signal input terminal 515, a first signal input and output terminal (hereinafter called a "first I/O terminal") 502 and a second I/O terminal 508.

The driver circuit 1000 can operate the output level selection circuit 514 in the form of two groups corresponding to the liquid-crystal driving terminals 1 through 50 and the liquid-crystal driving terminals 51 through 100, i.e., divide the bidirectional shift register 530 every 50 stages. When a signal input to the second signal input terminal 501 of the bidirectional shift register 530 is "L" in level and a signal input to the fourth signal input terminal (hereinafter abbreviated as a "MODE terminal") 515 is "H" in level, the initial ten stages are brought to non-operating conditions. When, on the other hand, the signal input to the second signal input terminal 501 is "H" in level and the signal input to the MODE terminal 515 is "L" in level, the last ten stages are brought to the non-operating conditions. The shift register 530 has a plurality of data latch circuits 550. Each of the data latch circuits 550 comprises a data flip-flop (hereinafter abbreviated as a "DF/F") 103, a three-state circuit 531-1 having two three-state inverters (hereinafter called "SINVs") 101 and 102 whose outputs are electrically connected to a data input terminal (hereinafter abbreviated as a "D terminal") of the DF/F 103, and an inverter 104 whose input is electrically connected to the Q output of the DF/F 103. The data latch circuits 550 are employed in the form of 100 stages in total. However, the data latch circuits 550 are identical in circuit configurations and electrical connections to one another and their description will therefore be omitted. The shift register 530 has a control circuit 506 for controlling the switching action of connecting the first I/O terminal 502 to either the input of the SINV 102 or the output of the inverter 104. The control circuit 506 is not illustrated in circuit configuration but has two transistors (not shown) which are respectively electrically connected between the first I/O terminal 502 and the SINV 102 and between the first I/O terminal 502 and the inverter 104 and which respectively have control terminals supplied with a complementary signal from the second signal input terminal 501. Incidentally, control circuits 507, 523, 525 are not also shown but identical in structure to one another. The shift register 530 supplies the signal input to the second signal input terminal 501 to each of the SINV 101, SINVs 105, . . . . An inverter 505 inverts the input signal. The shift register 530 is then activated so as to supply the inverted signal to control terminals of the control circuits 507 and 523, and the SINV 102, SINVs 106, . . . . Incidentally, the signal which has been inverted by the inverter 505 is further inverted by an inverter 524 so as to be supplied to a control terminal of the control circuit 525. First input terminals of AND circuits 518 and 529 are respectively electrically connected to the first and second I/O terminals 502 and 508. Further, the output terminals of the AND circuits 518 and 529 are electrically connected to the SINV 102 and an SINV 497 respectively. Second input terminals of the AND circuits 518 and 529 are supplied with a signal obtained by inverting the signal input to the MODE terminal 515 with an inverter 519. A control circuit 532-1 comprises two SINVs 521 and 522. The input terminal of the SINV 521 is electrically connected to the output terminal of a DF/F 139 which serves as a tenth stage. The input terminal of the SINV 522 is supplied with a signal obtained by inverting the signal supplied from the first I/O terminal 502 with an inverter 520. The outputs of the SINVs 521 and 522 are electrically connected in common to the input of the SINV 142. The SINV 142 is electrically connected to a DF/F 143 which serves as an eleventh stage. A control terminal of the SINV 521 is electrically connected to the MODE terminal 515 via the inverter 519, whereas a control terminal of the SINV 522 is electrically connected to the MODE terminal 515. Incidentally, a control circuit 532-2 is identical in circuit configurations and electrical connections to the control circuit 532-1 and their description will therefore be omitted.

The control circuits 523 and 525 electrically connected between the data latch circuit corresponding to the fiftieth stage and the data latch circuit corresponding to the fifty-first stage are provided to effect the overall operation of the driver circuit 1000 half by half. In order to enable the overall operation of the driver circuit 1000, third and fourth I/O terminals 516 and 517 electrically connected to their corresponding control circuits 523 and 525 may be connected to each other.

The operation of the driver circuit 1000 will next be described below. A description will first be made of the case where a signal of an "L" level is input to the MODE terminal 515. Since the output levels of the AND circuits 518 and 529 are respectively determined based on the signals input from the first and second I/O terminals 502 and 508, each of the SINV 522 and an SINV 527 is brought to a high impedance state. Thus, when an "L" level signal is input to the second signal input terminal 501, the signal input from the first I/O terminal 502 and a signal input from the fourth I/O terminal 517 are shifted in an a direction each time a signal input to the third signal input terminal 503 falls. As a result, signals are output from the third I/O terminal 516 and the second I/O terminal 508 respectively. When, on the other hand, an "H" level signal is input to the second signal input terminal 501, signals input from the third and second I/O terminals 516 and 508 are shifted in a b direction each time the signal input to the third signal input terminal 503 falls. As a result, signals are output from the first and fourth I/O terminals 502 and 517 respectively.

A description will next be made of the case where an "H" level signal is input to the MODE terminal 515. When the "L" level signal is input to the second signal input terminal 501, the signal output from the AND circuit 518 is rendered "L" in level regardless of the signal input to the first I/O terminal 502 under the operations of the data latch circuits corresponding to the liquid-crystal driving terminals 1 through 50. Thereafter, the "L" level signal output from the AND circuit 518 is supplied to the SINV 102. The signal input from the I/O terminal 502 is inverted by the inverter 520, followed by being input to the SINV 522. At this time, the SINV 521 is brought to a high impedance state because the signal input to the MODE terminal 515 is "H" in level. Therefore, the signal inverted by the SINV 522 is input to the SINV 142. Since the signal input to the first signal input terminal 501 is "L" in level, an SINV 141 is brought to a high impedance state. Therefore, the signal inverted by the SINV 142 is supplied to the D terminal of the DF/F 143. When the signal input to the third signal input terminal 503 falls, the inverted signal is read into the DF/F 143 so that a desired signal is output from the Q terminal thereof. The signal output from the Q terminal of the DF/F 143 is inverted by an inverter 144. Thereafter, the inverted signal is input to both an SINV of the next unillustrated data latch circuit and the output level selection circuit 514 (while the output of the inverter 144 is also input to the SINV 137, the output thereof is brought to the high impedance state because the "L" level signal is input to the second signal input terminal 501 and hence the inverter 144 is in a non-operating state, and its description will therefore be omitted).

Each time the signal input to the third signal input terminal 503 falls, the signal input from the first I/O terminal 502 is shifted in the a direction so as to be output from the third I/O terminal 516. Each time the signal input to the third signal input terminal 503 falls, the signal input from the fourth I/O terminal 517 is shifted in the a direction under the operations of the data latch circuits corresponding to the liquid-crystal driving terminals 51 through 100 in the same manner as when the signal input to the MODE terminal 515 is "L" in level, thereby outputting a signal from the second I/O terminal 508.

When the "H" level signal is input to the second signal input terminal 501, the signal input from the third I/O terminal 516 is shifted in the b direction for each falling of the signal input to the third signal input terminal 503 under the operations of the data latch circuits corresponding to the liquid-crystal driving terminals 1 through 50 in the same manner as when the MODE terminal 515 is supplied with the "L" level signal, thereby generating a signal from the first I/O terminal 502. In the data latch circuits corresponding to the liquid-crystal driving terminals 51 through 100, the signal output from the AND circuit 529 is rendered "L"

in level irrespective of the signal input from the second I/O terminal 508 and then input to the SINV 497. Further, the signal input from the second I/O terminal 508 is inverted by an inverter 528, followed by being input to the SINV 527. At this time, an SINV 526 is brought to a high impedance state owing to the existence of the "H" level signal input from the MODE terminal 515. A signal inverted by the inverter 527 is input to an SINV 457. Since the signal input to the second signal input terminal 501 is "H" in level, an SINV 458 is brought to a high impedance state. A DF/F 459 receives therein the signal inverted by the SINV 457 at the D terminal thereof and reads it therein so as to be output from the Q terminal thereof when the signal input to the third signal input terminal 503 falls. Then, an inverter 460 inverts the signal output from the Q terminal of the DF/F 459 and supplies the inverted signal to an SINV of the next unillustrated data latch circuit and the output level selection circuit 514.

Each time the signal input to the third signal input terminal 503 falls, the signal input from the second I/O terminal 508 is shifted in the b direction so as to be output from the fourth I/O terminal 517 (while the output of the inverter 460 is also input to an SINV 462, the output thereof is brought to the high impedance state because the "H" level signal is input to the second signal input terminal 501 thus making the inverter 144 non-operative and its description will therefore be omitted).

As described above, when the signal input to the second signal input terminal 501 is "L" in level and the signal input to the MODE terminal 515 is "H" in level, signals are not output from the liquid-crystal driving terminals 1 through 10. When the signal input to the second signal input terminal 501 is "H" in level and the signal input to the MODE terminal 515 is "H" in level, signals are not output from the liquid-crystal driving terminals 91 through 100.

Figure 2:
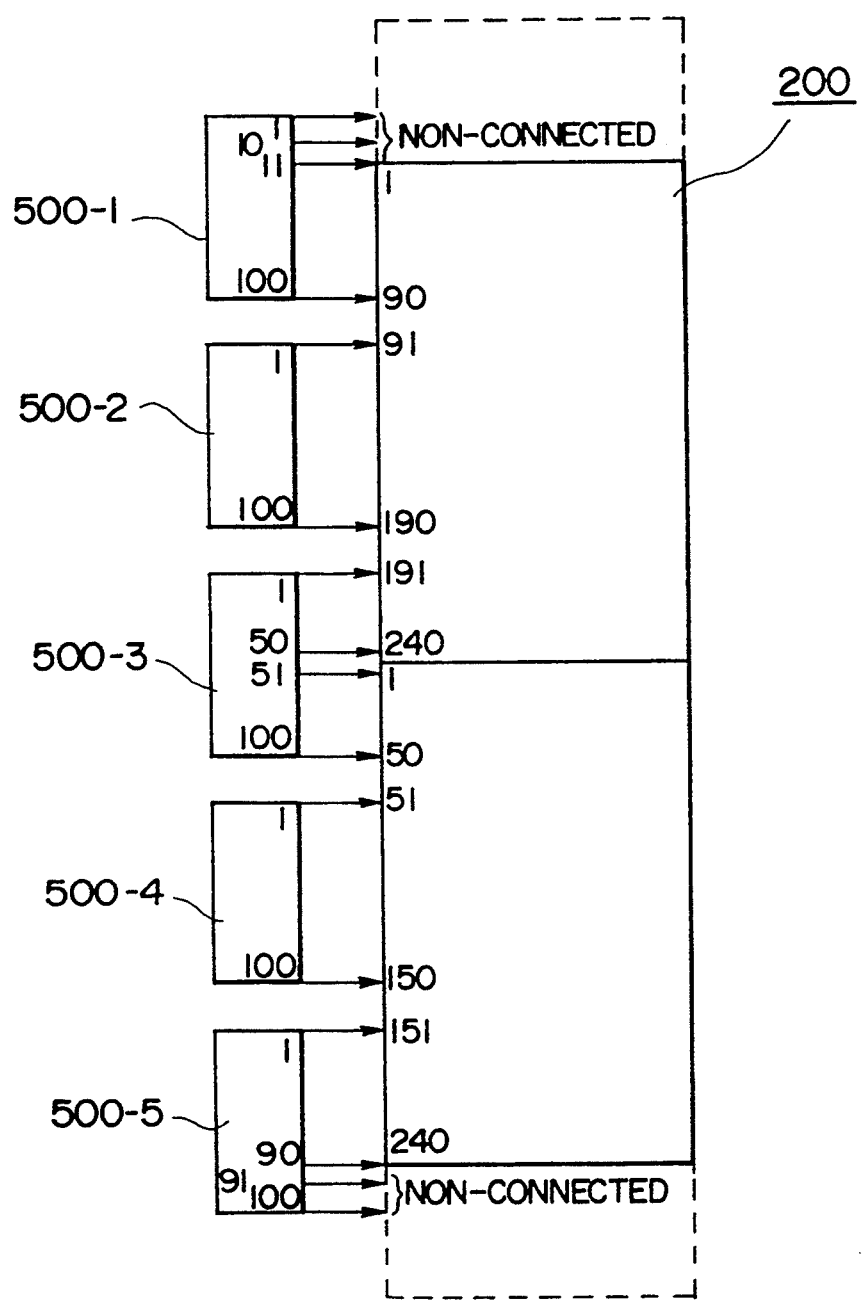
FIG. 2 is a diagram illustrating the electrical connections between the driver circuit shown in FIG. 1 and a liquid-crystal panel.

FIG. 2 is a diagram showing the electrical connections between the driver circuit 1000 shown in FIG. 1 and a liquid-crystal panel having 480 driving signal conductors or lines.

The liquid-crystal panel 200 is electrically connected with five driver circuits 500-1 through 500-5. The liquid-crystal driving terminals 1 through 10 of the first driver circuit 500-1 are not electrically connected to the liquid-crystal panel, whereas the liquid-crystal driving terminals 11 through 100 thereof are electrically connected to their corresponding signal lines of the liquid-crystal panel. The liquid-crystal driving terminals 91 through 100 of the fifth driver circuit 500-5 are not electrically connected to the liquid-crystal panel, whereas the liquid-crystal driving terminals 1 through 90 of the fifth driver circuit 500-5 are electrically connected to their corresponding signal lines of the liquid-crystal panel 200.

Figure 3:
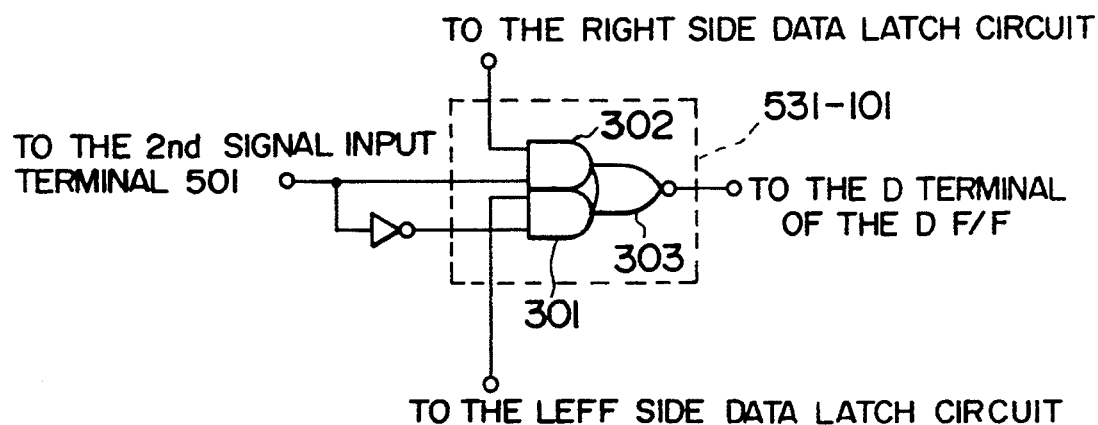
FIG. 3 is a diagram depicting another example of a three-state circuit of the driver circuit shown in FIG. 1.

In the above-described embodiment, each of the three-state circuits 531-1 through 531-100 for determining the shift direction of the shift register 530 of the driver circuit 1000 comprises two three-state inverters. However, at least one of the three-state circuits 531-1 through 531-100 may be replaced by a circuit 531-101 which is comprised of three-state circuits each comprising two-input AND circuits 301 and 302 and a two-input NOR circuit 303 as shown in FIG. 3.

Figure 4:
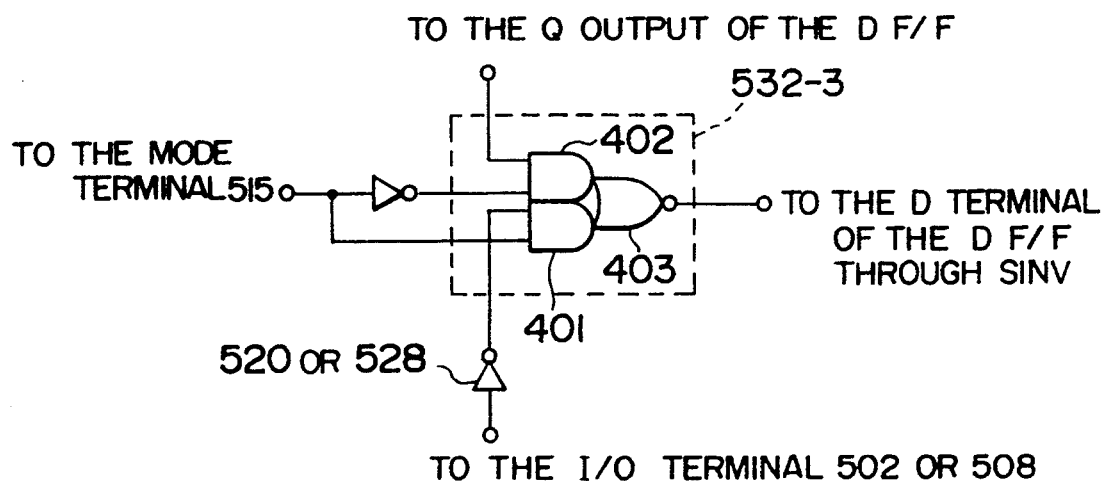
FIG. 4 is a diagram showing another example of a control circuit of the driver circuit shown in FIG. 1.

Further, the control circuits 532-1 and 532-2 for determining whether or not the ten output terminals should be made non-operative are made up of two three-state inverters respectively. Each of the control circuits 532-1 and 532-2 may, however, be replaced by a circuit 532-3 which is comprised of two-input AND circuits 401 and 402 and a two-input NOR circuit 403 as shown in FIG. 4.

Figure 5:
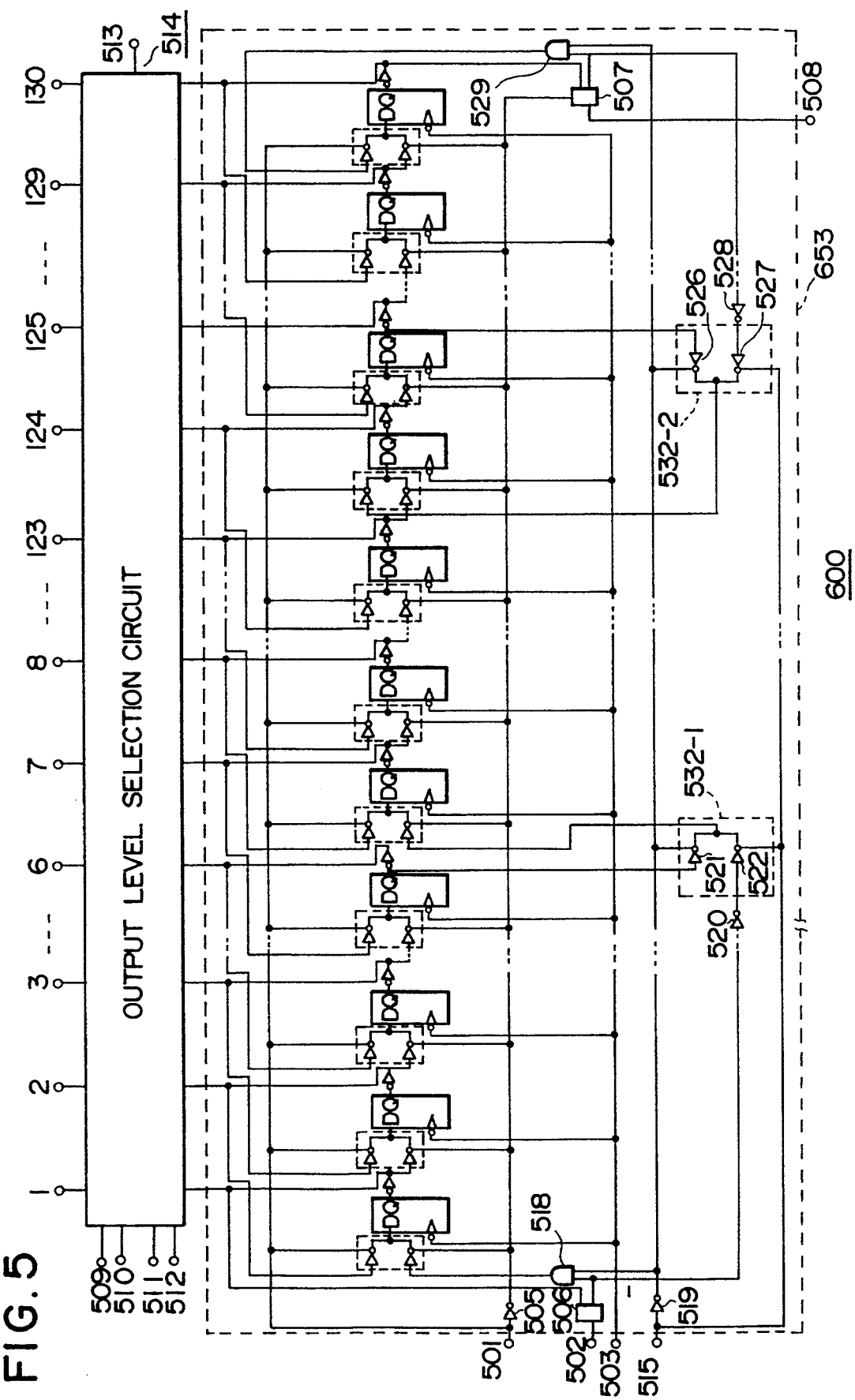
FIG. 5 is a diagram illustrating a driver circuit according to a second embodiment of the present invention.
Figure 6:
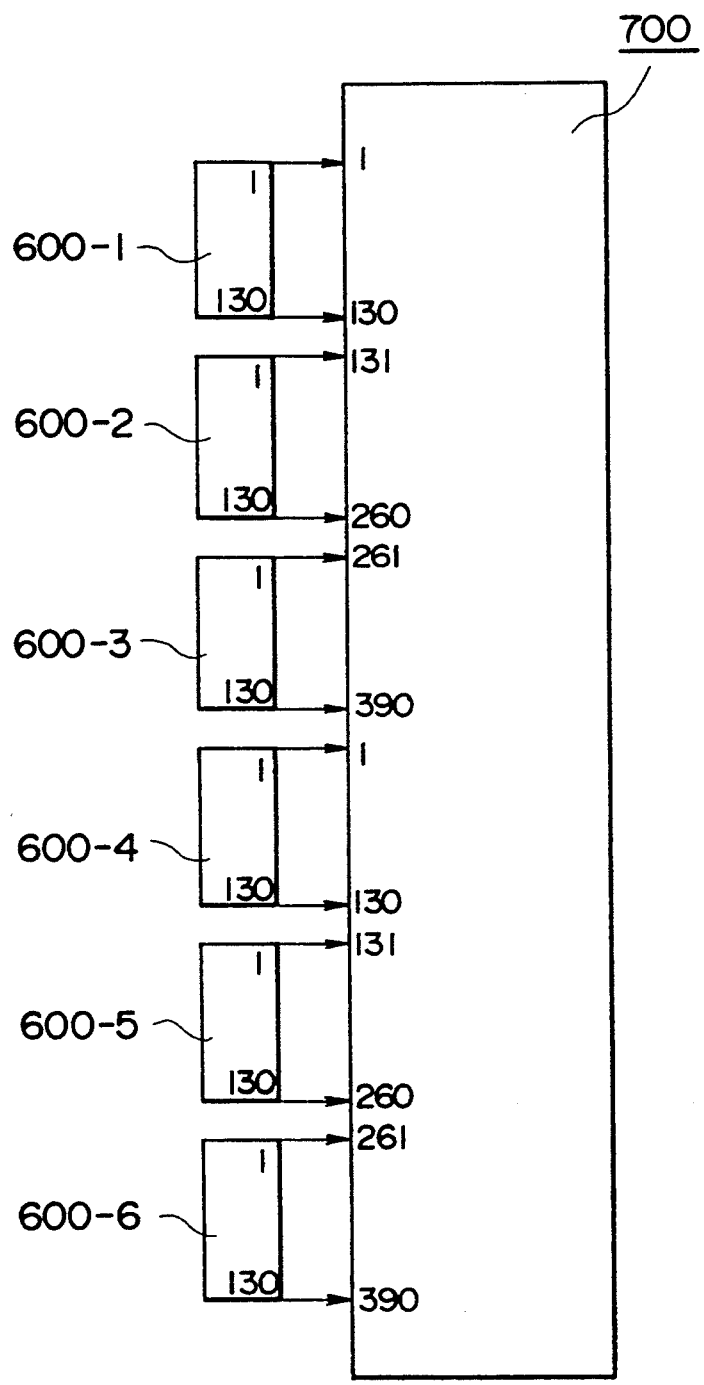
FIG. 6 is a diagram depicting the electrical connections between the driver circuit depicted in FIG. 5 and a liquid-crystal panel.
Figure 7:
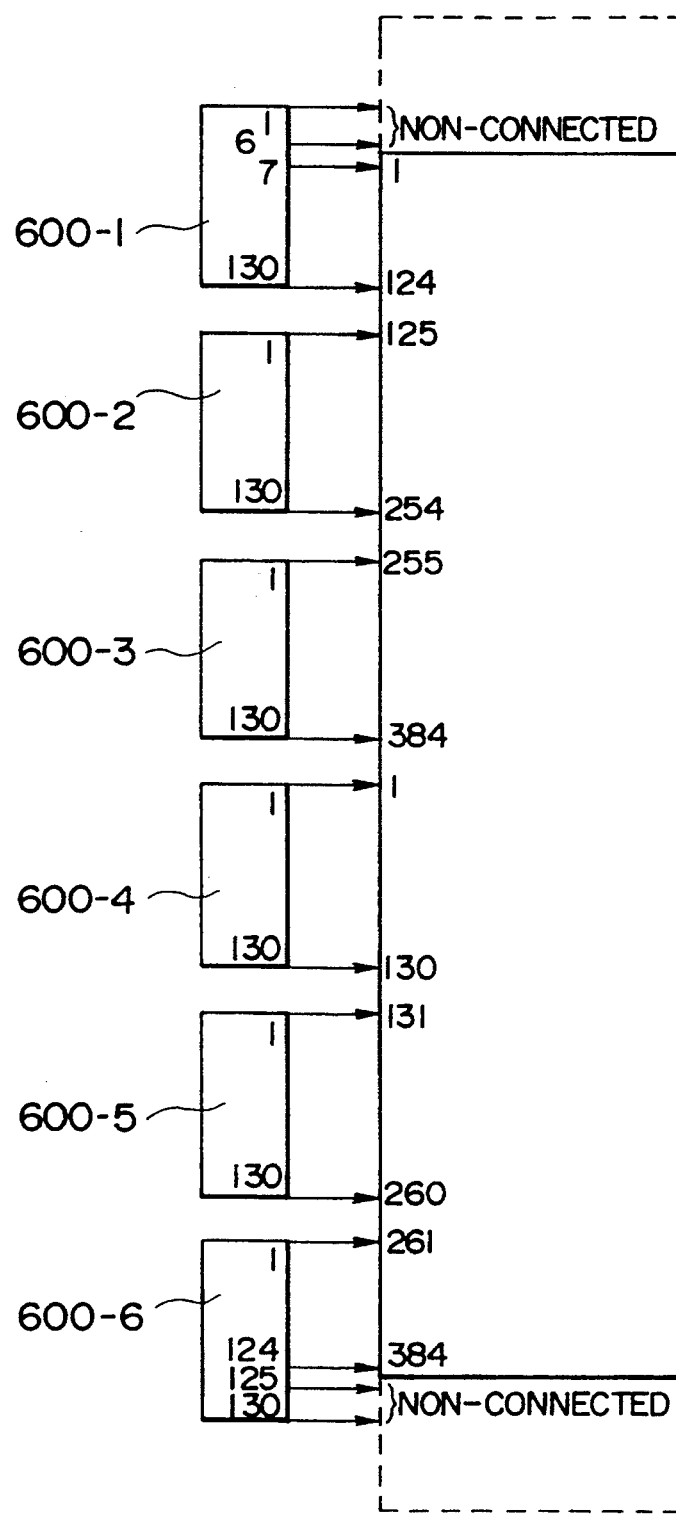
FIG. 7 is a diagram showing the electrical connections between the driver circuit shown in FIG. 5 and another liquid-crystal panel.

As high-definition liquid-crystal panels, there are known those such as a liquid-crystal panel having the number of DOTs equal to 1120×780, a liquid-crystal panel having the number of DOTs equal to 1120×768, etc. Each of these liquid-crystal panels has the number of driving signal lines corresponding to 780 or 768. FIG. 5 shows a driver circuit according to a second embodiment of the present invention. The same elements of structure as those shown in FIG. 1 are identified by the same reference numerals and their description will therefore be omitted. The driver circuit 600 can make the initial or final six signal lines nonoperative. Further, the driver circuit 600 cannot operate a shift register 653 in division form. Furthermore, the driver circuit 600 has liquid-crystal driving terminals 1 through 130. The operation of the driver circuit 600 is just the same as that of the driver circuit 500 except for the respective features referred to above and its description will therefore be omitted. FIGS. 6 and 7 are respectively diagrams showing the electrical connections between the driver circuits 600-1 through 600-6 and respective liquid-crystal panels 700, 800 each having the number of DOTs corresponding to 1120×780 or 1120×768.

According to the driver circuits of the present invention, as has been described above, predetermined driving output terminals do not output signals. Therefore, even if driving signal lines of respective liquid-crystal panels are different in number from each other, the driver circuit can be used in common, thereby making it possible to facilitate the stock control of driver circuits. Further, attention is now being paid to a TAB used as a package of a liquid-crystal driving IC in order to reduce each liquid-crystal panel in weight and thickness. Since a metal mold used for the TAB can be used in common, the TAB can be reduced in cost.

Having now fully described the invention, it will be apparent to those skilled in the art that many changes and modifications can be made without departing from the spirit or scope of the invention as set forth herein.

What is claimed is:

1. A driver circuit comprising:
   an output level selection circuit having:
      a plurality of driving terminals;
      a plurality of potential level input terminals for receiving a plurality of electrical potential levels; and
      a plurality of data terminals for receiving data signals, the output level selection circuit for outputting a signal having one of the electrical potential levels from the driving terminals in response to the received data signals; and
   a register having:
      an input terminal;
      an output terminal;
      a control terminal for receiving a control signal having a first state and a second state; and
      a shift register for generating the data signals received by the data terminals of the output level selection circuit, the shift register being coupled to each of the data terminals of the output level selection circuit, the control terminal and the input and output terminals, the shift register including:
  a first shift circuit including a plurality of serially coupled data latch circuits, the first shift circuit having an input coupled to the input terminal and an output;
  a second shift circuit including a plurality of serially coupled data latch circuits, the second shift circuit having an input and an output coupled to the output terminal; and
  a control circuit having inputs coupled to the input terminal, the output of the first shift circuit, and the control terminal, the control circuit having an output coupled to the input of the second shift circuit, the control circuit for coupling the input terminal and the input of the second shift circuit when the control signal is in the first state and for coupling the output of the first shift circuit and the input of the second shift circuit when the control signal is in the second state.

2. A driver circuit according to claim 1, wherein each data latch circuit includes a data flip-flop circuit having a data input terminal and a data output terminal.

3. A driver circuit according to claim 2, wherein each data latch circuit further includes a three-state inverter coupled to the data input terminal of the data flip-flop circuit and an inverter coupled to the data output terminal of the data flip-flop circuit.

4. A driver circuit according to claim 1, wherein the control circuit includes:
  a first three-state inverter having an input coupled to the output of the first shift circuit, an output coupled to the input of the second shift circuit, and a control input coupled to the control terminal; and
  a second three-state inverter having an input coupled to the input terminal, an output coupled to the input of the second shift circuit, and a control input coupled to the control terminal.

5. A driver circuit comprising:
an output level selection circuit having:
  a plurality of driving terminals;
  a plurality of potential level input terminals for receiving a plurality of electrical potential levels; and
  a plurality of data terminals for receiving data signals, the output level selection circuit for outputing a signal having one of the electrical potential levels from the driving terminals in response to the received data signals; and
a register having:
  a first input terminal;
  a second input terminal;
  a first output terminal;
  a second output terminal;
  a control terminal for receiving a control signal having a first state and a second state; and
  a shift register for generating the data signals received by the data terminals of the output level selection circuit, the shift register being coupled to each of the data terminals of the output level selection circuit, the control terminal, the first and second input terminals, and the first and second output terminals, the shift register including:
    a first shift circuit including a plurality of serially coupled data latch circuits, the first shift circuit having an input coupled to the first input terminal and an output;
    a second shift circuit including a plurality of serially coupled data latch circuits, the second shift circuit having an input and an output coupled to the second output terminal;
    a third shift circuit including a plurality of serially coupled data latch circuits, the third shift circuit having an input coupled to the second input terminal and an output coupled to the first output terminal; and
    a control circuit having inputs coupled to the first input terminal, the output of the first shift circuit, and the control terminal, the control circuit having an output coupled to the input of the second shift circuit, the control circuit for coupling the first input terminal and the input of the second shift circuit when the control signal is in the first state and for coupling the output of the first shift circuit and the input of the second shift circuit when the control signal is in the second state.

6. A driver circuit according to claim 5, wherein each data latch circuit includes a data flip-flop circuit having a data input terminal and a data output terminal.

7. A driver circuit according to claim 6, wherein the data latch circuit further includes a three-state inverter coupled to the data input terminal of the data flip-flop circuit and an inverter coupled to the data output terminal of the data flip-flop circuit.

8. A driver circuit according to claim 5, wherein the control circuit includes:
  a first three-state inverter having an input coupled to the output of the first shift circuit, an output coupled to the input of the second shift circuit, and a control input coupled to the control terminal; and
  a second three-state inverter having an input coupled to the first input terminal, an output coupled to the input of the second shift circuit, and a control input coupled to the control terminal.

9. A driver circuit comprising:
an output level selection circuit having:
  a plurality of driving terminals;
  a plurality of potential level input terminals for receiving a plurality of electrical potential levels; and
  a plurality of data terminals for receiving data signals, the output level selection circuit for outputing a signal having one of the electrical potential levels from the driving terminals in response to the received data signals; and
a register having:
  a first input/output terminal;
  a second input/output terminal;
  a first control terminal receiving a first control signal having a first state and a second state;
  a second control terminal receiving a second control signal having a first state and a second state; and
  a bi-directional shift register for generating the data signals received by the data terminals of the output level selection circuit, the shift register being coupled to each of the data terminals of the output level selection circuit, the first and second control terminals and the first and second input/output terminals, the shift register including:
    a first control circuit having inputs coupled to the first control terminal and the second control terminal, the first control circuit having a first terminal coupled to the first input/output terminal, a second terminal, a third terminal, and a fourth terminal, the first control circuit for coupling the first and second terminals thereof when the first control signal is in the first state, for coupling the first and third terminals thereof when the first control signal is in the second state and when the second control signal is in the first state, and for coupling the first and fourth terminals thereof when the first control signal is in the second state;

a first bi-directional shift circuit including a plurality of serially coupled data latch circuits having first and second opposite end data latch circuits, the first shift circuit having a first input at the first end circuit coupled to the third terminal of the first control circuit, a second input at the second end circuit, a first output at the first end circuit coupled to the second terminal of the first control circuit, and a second output at the second end circuit;

a second control circuit having an input coupled to the first control terminal, the second control circuit having a first terminal coupled to the second input/output terminal, a second terminal, and a third terminal, the second control circuit for coupling the first and second terminals thereof when the first control signal is in the first state and for coupling the first and third terminals thereof when the first control signal is in the second state;

a second bi-directional shift circuit including a plurality of serially coupled data latch circuits having third and fourth opposite end data latch circuits, the second shift circuit having a first input at the fourth end circuit coupled to the third terminal of the second control circuit, a second input at the third end circuit, a first output at the fourth end circuit coupled to the second terminal of the second control circuit, and a second output at the fourth end circuit coupled to the second input of the first shift circuit;

a third control circuit having a first input coupled to the fourth terminal of the first control circuit, a second input coupled to the second output of the first shift circuit, a third input coupled to the second control terminal, and an output coupled to the second input of the second shift circuit, the third control circuit for coupling the first input and the output thereof when the second control signal is in the first state and for coupling the second input and the output thereof when the second control signal is in the second state.

10. A driver circuit according to claim 9 wherein the first control circuit includes:

a switching circuit having an input coupled to the first control terminal and having a first terminal coupled to the first terminal of the first control circuit, a second terminal coupled to the second terminal of the first control circuit, and a third terminal coupled to the fourth terminal of the first control circuit, the switching circuit for coupling the first and second terminals thereof when the first control signal is in the first state and for coupling the first and third terminals thereof when the first control signal is in the second state; and an enabling circuit having a first input coupled to the fourth terminal of the first control circuit, a second input coupled to the second control terminal, and an output coupled to the third terminal of the first control circuit, the enabling circuit for coupling the first input and the output thereof when the second control signal is in the first state.

11. A driver circuit according to claim 9 wherein each of the data latch circuits includes:

a first input terminal;

a first three-state inverter having an input coupled to the first input terminal and an output;

a second input terminal;

a second three-state inverter having an input coupled to the second input terminal and an output;

a data flip-flop circuit having a data terminal coupled to the output of the first three-state inverter and the output of the second three-state inverter, and an output; and an inverter having an input coupled to the output of the data flip-flop circuit and an output connected to an output terminal.

12. A driver circuit according to claim 11 wherein the first three-state inverter further comprises a control terminal coupled to the first control terminal for receiving the first control signal and wherein the second three-state inverter further comprises a control terminal coupled to the first control terminal through an inverter for receiving the first control signal.

13. A driver circuit according to claim 11 wherein the first state of the first control signal enables the first three-state inverter and the second state of the first control signal enables the second three-state inverter.

14. A driver circuit according to claim 9 wherein the third control circuit includes:

a first three-state inverter having an input coupled to the fourth terminal of the first control circuit, an output coupled to the second input of the second shift circuit, and a control terminal for receiving the second control signal; and a second three-state inverter having an input coupled to the second output of the first shift circuit, an output coupled to the second input of the second shift circuit, and a control terminal for receiving the second control signal.

15. A driver circuit according to claim 14 wherein the first state of the second control signal enables the first three-state circuit and the second state of the second control signal enables the second three-state circuit.

16. A driver circuit comprising:

an output level selection circuit having:
  a plurality of driving terminals;
  a plurality of potential level input terminals for receiving a plurality of electrical potential levels; and
  a plurality of data terminals for receiving data signals, the output level selection circuit for outputing a signal having one of the electrical potential levels from the driving terminals in response to the received data signals; and a register having:
  a first input/output terminal;
  a second input/output terminal;
  a third input/output terminal;
  a fourth input/output terminal;

a first control terminal for receiving a first control signal having a first state and a second state;

a second control terminal for receiving a second control signal having a first state and a second state; and a bi-directional shift register for generating the data signals received by the data terminals of the output level selection circuit, the shift register being coupled to each of the data terminals of the output level selection circuit, the first and second control terminals and the first, second, third, and fourth input/output terminals, the shift register including:

a first control circuit having inputs coupled to the first control terminal and the second control terminal, the first control circuit having a first terminal coupled to the first input/output terminal, a second terminal, a third terminal, and a fourth terminal, the first control circuit for coupling the first and second terminals thereof when the first control signal is in the first state, for coupling the first and third terminals thereof when the first control signal is in the second state and when the second control signal is in the first state, and for coupling the first and fourth terminals thereof when the first control signal is in the second state;

a first bi-directional shift circuit including a plurality of serially coupled data latch circuits having first and second opposite end data latch circuits, the first shift circuit having a first input at the first end circuit coupled to the third terminal of the first control circuit, a second input at the second end circuit, a first output at the first end circuit coupled to the second terminal of the first control circuit, and a second output at the second end circuit;

a second control circuit having inputs coupled to the first control terminal and the second control terminal, the second control circuit having a first terminal coupled to the second input/output terminal, a second terminal, a third terminal, and a fourth terminal, the second control circuit for coupling the first and second terminals thereof when the first control signal is in the second state, for coupling the first and third terminals thereof when the first control signal is in the first state and when the second control signal is in the first state, and for coupling the first and fourth terminals thereof when the first control signal is in the first state;

a second bi-directional shift circuit including a plurality of serially coupled data latch circuits having third and fourth opposite end data latch circuits, the second shift circuit having a first input at the fourth end circuit coupled to the third terminal of the second control circuit, a second input at the third end circuit, a first output at the fourth end circuit coupled to the second terminal of the second control circuit, and a second output at the third end circuit;

a third control circuit having an input coupled to the first control terminal, the third control circuit having a first terminal coupled to the third input/output terminal, a second terminal, and a third terminal, the third control circuit for coupling the first and second terminals thereof when the first control signal is in the second state and for coupling the first and third terminals thereof when the first control signal is in the first state;

a third bi-directional shift circuit including a plurality of serially coupled data latch circuits having fifth and sixth opposite end data latch circuits, the third shift circuit having a first input at the sixth end circuit coupled to the third terminal of the third control circuit, a second input at the fifth end circuit, a first output at the sixth end circuit coupled to the second terminal of the third control circuit, and a second output at the fifth end circuit coupled to the second input of the first shift circuit;

a fourth control circuit having an input coupled to the first control terminal, the fourth control circuit having a first terminal coupled to the fourth input/output terminal, a second terminal, and a third terminal, the fourth control circuit for coupling the first and second terminals thereof when the first control signal is in the first state and for coupling the first and third terminals thereof when the first control signal is in the second state;

a fourth bi-directional shift circuit including a plurality of serially coupled data latch circuits having seventh and eighth opposite end data latch circuits, the fourth shift circuit having a first input at the seventh end circuit coupled to the third terminal of the fourth control circuit, a second input at the eighth end circuit, a first output at the seventh end circuit coupled to the second terminal of the fourth control circuit, and a second output at the eighth end circuit coupled to the second input of the second shift circuit;

a fifth control circuit having a first input coupled to the fourth terminal of the first control circuit, a second input coupled to the second output of the first shift circuit, a third input coupled to the second control terminal, and an output coupled to the second input of the third shift circuit, the fifth control circuit for coupling the first input and the output thereof when the second control signal is in the first state and for coupling the second input and the output thereof when the second control signal is in the second state; and a sixth control circuit having a first input coupled to the fourth terminal of the second control circuit, a second input coupled to the second output of the second shift circuit, a third input coupled to the second control terminal, and an output coupled to the second input of the fourth shift circuit, the sixth control circuit for coupling the first input and the output thereof when the second control signal is in the first state and for coupling the second input and the output thereof when the second control signal is in the second state.

17. A driver circuit according to claim 16 wherein the first control circuit includes:

a switching circuit having an input coupled to the first control terminal and having a first terminal coupled to the first terminal of the first control circuit, a second terminal coupled to the second terminal of the first control circuit, and a third terminal coupled to the fourth terminal of the first control circuit, the switching circuit for coupling the first and second terminals thereof when the first control signal is in the first state and for coupling the first and third terminals thereof when the first control signal is in the second state; and an enabling circuit having a first input coupled to the fourth terminal of the first control circuit, a second input coupled to the second control terminal, and an output coupled to the third terminal of the first control circuit, the enabling circuit for coupling the first input and the output thereof when the second control signal is in the first state.

18. A driver circuit according to claim 16 wherein the second control circuit includes:

a switching circuit having an input coupled to the first control terminal and having a first terminal coupled to the first terminal of the second control circuit, a second terminal coupled to the second terminal of the second control circuit, and a third terminal coupled to the fourth terminal of the second control circuit, the switching circuit for coupling the first and second terminals thereof when the first control signal is in the first state and for coupling the first and third terminals thereof when the first control signal is in the second state; and an enabling circuit having a first input coupled to the fourth terminal of the second control circuit, a second input coupled to the second control terminal, and an output coupled to the third terminal of the second control circuit, the enabling circuit for coupling the input and output thereof when the second control signal is in the first state.

19. A driver circuit according to claim 16 wherein each of the data latch circuits includes:

a first input terminal;

a first three-state inverter having an input coupled to the first input terminal and an output;

a second input terminal;

a second three-state inverter having an input coupled to the second input terminal and an output;

a data flip-flop circuit having a data terminal coupled to the output of the first three-state inverter and the output of the second three-state inverter, and an output; and an inverter having an input coupled to the output of the data flip-flop circuit and an output connected to an output terminal.

20. A driver circuit according to claim 19 wherein the first three-state inverter further comprises a control terminal coupled to the first control terminal for receiving the first control signal and wherein the second three-state inverter further comprises a control terminal coupled to the first control terminal through an inverter for receiving the first control signal.

21. A driver circuit according to claim 19 wherein the first state of the first control signal enables the first three-state inverter and the second state of the first control signal enables the second three-state inverter.

22. A driver circuit according to claim 16 wherein the fifth control circuit includes:

a first three-state inverter having an input coupled to the fourth terminal of the first control circuit, an output coupled to the second input of the third shift circuit, and a control terminal for receiving the second control signal; and a second three-state inverter having an input coupled to the second output of the first shift circuit, an output coupled to the second input of the third shift circuit, and a control terminal for receiving the second control signal.

23. A driver circuit according to claim 16 wherein the sixth control circuit includes:

a first three-state inverter having an input coupled to the fourth terminal of the second control circuit, an output coupled to the second input of the fourth shift circuit, and a control terminal for receiving the second control signal; and a second three-state inverter having an input coupled to the second output of the second shift circuit, an output coupled to the second input of the fourth shift circuit, and a control terminal for receiving the second control signal.

* * * * *